(12) United States Patent
Gangakhedkar et al.

(10) Patent No.: US 10,774,006 B2
(45) Date of Patent: Sep. 15, 2020

(54) MICROWAVE AND INDUCTION HEAT TREATMENT OF CERAMIC COATINGS

(71) Applicant: Applied Materials, Inc., Santa Clara, CA (US)

(72) Inventors: Kaushal Gangakhedkar, San Jose, CA (US); Jennifer Y. Sun, Mountain View, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 15/976,704

(22) Filed: May 10, 2018

(65) Prior Publication Data

US 2018/0327325 A1 Nov. 15, 2018

Related U.S. Application Data

(60) Provisional application No. 62/504,472, filed on May 10, 2017.

(51) Int. Cl.
| | | |
|---|---|---|
| C04B 35/50 | (2006.01) | |
| C04B 35/505 | (2006.01) | |
| C04B 35/622 | (2006.01) | |
| C23C 4/11 | (2016.01) | |
| C23C 4/134 | (2016.01) | |
| C23C 14/08 | (2006.01) | |
| C23C 14/22 | (2006.01) | |
| C23C 16/40 | (2006.01) | |

(Continued)

(52) U.S. Cl.
CPC ........ *C04B 35/62222* (2013.01); *C04B 35/44* (2013.01); *C04B 35/486* (2013.01); *C04B 35/50* (2013.01); *C04B 35/505* (2013.01); *C04B 35/64* (2013.01); *C23C 4/11* (2016.01); *C23C 4/134* (2016.01); *C23C 4/18* (2013.01); *C23C 14/08* (2013.01); *C23C 14/221* (2013.01); *C23C 14/5806* (2013.01); *C23C 16/40* (2013.01); *C23C 16/403* (2013.01); *C23C 16/405* (2013.01); *C23C 16/45525* (2013.01); *C23C 16/56* (2013.01); *C23C 24/04* (2013.01); *C04B 2235/3222* (2013.01); *C04B 2235/3224* (2013.01); *C04B 2235/3225* (2013.01); *C04B 2235/3246* (2013.01); *C04B 2235/6562* (2013.01); *C04B 2235/66* (2013.01); *C04B 2235/667* (2013.01)

(58) Field of Classification Search
CPC .... C23C 4/11; C23C 4/10; C23C 4/18; C23C 4/134; C23C 24/08; C23C 24/082; C23C 24/085; C23C 24/10; C23C 24/103; C23D 5/04; C23D 9/06; C23D 1/00; C04B 35/62222; C04B 35/50; C04B 35/505; C04B 35/64
See application file for complete search history.

(56) References Cited

U.S. PATENT DOCUMENTS

| | | |
|---|---|---|
| 9,034,199 B2 | 5/2015 | Duan et al. |
| 9,212,099 B2 | 12/2015 | Sun et al. |

(Continued)

*Primary Examiner* — Michael P Wieczorek
(74) *Attorney, Agent, or Firm* — Lowenstein Sandler LLP

(57) ABSTRACT

Methods comprise loading an article comprising a ceramic coating into an induction heating system or a microwave heating system and heat treating the ceramic coating using the microwave heating system or the induction heating system within a temperature range for a duration of about 1-15 minutes.

13 Claims, 5 Drawing Sheets

(51) Int. Cl.
    *C23C 16/455*    (2006.01)
    *C23C 24/04*     (2006.01)
    *C23C 4/18*      (2006.01)
    *C23C 14/58*     (2006.01)
    *C23C 16/56*     (2006.01)
    *C04B 35/64*     (2006.01)
    *C04B 35/44*     (2006.01)
    *C04B 35/486*    (2006.01)

(56) References Cited

U.S. PATENT DOCUMENTS

| | | |
|---|---|---|
| 2009/0191356 A1 | 7/2009 | Lee et al. |
| 2009/0274850 A1 | 11/2009 | Bhatia et al. |
| 2015/0181685 A1 | 6/2015 | Sekhar et al. |
| 2016/0194764 A1* | 7/2016 | Patel ........................ C23D 5/04 |
| | | 427/591 |
| 2016/0208371 A1 | 7/2016 | Wang et al. |
| 2016/0254125 A1* | 9/2016 | Huang ............. H01J 37/32495 |
| | | 29/458 |

* cited by examiner

US 10,774,006 B2

MICROWAVE AND INDUCTION HEAT TREATMENT OF CERAMIC COATINGS

RELATED APPLICATIONS

This patent application claims the benefit under 35 U.S.C. § 119(e) of U.S. Provisional Application No. 62/504,472, filed May 10, 2017.

TECHNICAL FIELD

Embodiments of the present invention relate, in general, to a microwave and induction heat treatment process used to heat treat articles with ceramic coatings.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma. This corrosion may generate particles, which frequently contaminate the substrate that is being processed, contributing to device defects.

As device geometries shrink, susceptibility to defects increases, and particle contaminant requirements become more stringent. Accordingly, as device geometries shrink, allowable levels of particle contamination may be reduced. To minimize particle contamination introduced by plasma etch and/or plasma clean processes, chamber materials have been developed that are resistant to plasmas. Typically, chamber components are coated with plasma resistant coatings using plasma spray processes. The plasma sprayed coatings have a porosity of about 2-10% and many microcracks. Additionally, the plasma sprayed coatings generally have a low dielectric strength, high leakage currents and high average surface roughness of about 200-250 µ-inch. As a result, the plasma sprayed coatings often shed particles after plasma bombardment, which can reduce yield of manufactured devices.

SUMMARY

In one embodiment, a method comprises loading a metal article comprising a ceramic coating into an induction heating system. The method further comprises positioning an inductive plate of the induction heating system at a distance from a surface of the ceramic coating and does not touch the surface of the ceramic coating. The method further comprises applying an alternating current to the inductive plate to generate eddy currents in the metal article, wherein the eddy currents in the metal article heat up at least a portion of the metal article and at least a portion of the ceramic coating on the metal article to a temperature range between about 400° C. and about 2000° C. at a ramping rate of about 2-500° C. per minute. The method further comprises heat treating the ceramic coating at one or more temperatures within the temperature range for a duration of about 1-15 minutes.

In one embodiment, a method comprises loading an article comprising a ceramic coating into a microwave heating system. The method further comprises heating the ceramic coating using the microwave heating system to a temperature range between about 400° C. and about 2000° C. at a ramping rate of about 2-500° C. per minute. The method further comprises heat treating the ceramic coating at one or more temperatures within the temperature range for a duration of about 1-15 minutes.

In one embodiment, a method comprises disposing a ceramic powder onto a surface of an article. The method further comprises loading the article comprising the ceramic powder into a microwave heating system or an induction heating system. The method further comprises heating the ceramic powder using the microwave heating system or the induction heating system to a temperature range between about 400° C. and about 2000° C. at a ramping rate of about 2-500° C. per minute. The method further comprises heat treating the ceramic powder at one or more temperatures within the temperature range for a duration of about 1-15 minutes, wherein the heat treating causes the ceramic power to melt, reflow, and form a ceramic coating on the article.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
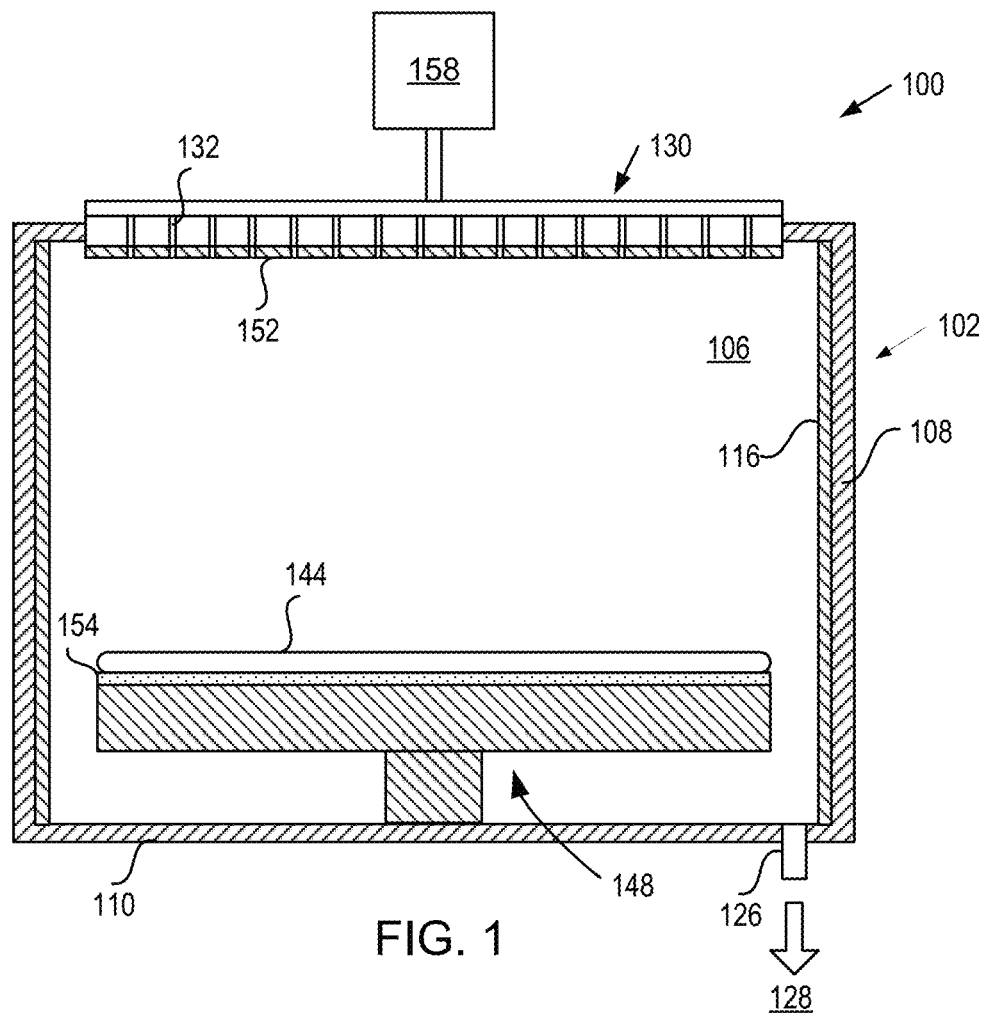
FIG. 1 depicts a sectional view of one embodiment of a processing chamber.

Embodiments of the invention are directed to a process for heat treating an article having a ceramic coating using a microwave heat treatment process or an induction heat treatment process, and to an article with a ceramic coating that has been processed using the heat treatment. In one embodiment, an article including a ceramic coating having an initial porosity, an initial bond strength to the article, an initial amount of cracking and an initial surface roughness is provided. The article may be a metal article or a sintered ceramic article, and the ceramic coating may have been deposited by plasma spraying, atomic layer deposition (ALD), ion assisted deposition (IAD), physical vapor deposition (PVD), chemical vapor deposition (CVD), or another deposition process. The article may be, for example, a lid, nozzle, showerhead, gas distribution plate, electrostatic chuck, or other chamber component for a processing chamber.

The microwave heat treatment process and the induction heat treatment process provide a number of unexpected advantages over other types of heat treatment, such as laser heat treatment, flame heat treatment and traditional furnace heat treatment. Both microwave heat treatment and induction heat treatment enable a rapid localized heating of the article and/or ceramic coating with minimal heating of additional objects and/or environment. The rapid localized heat treatment enables the ceramic coating to be quickly heated to high temperatures (e.g., of about 400-2000° C. in some embodiments) at ramping rates of up to about 500° C. per minute. Additionally, the microwave heating and induction heating use significantly less power than traditional heating (e.g., with a power expenditure on the order of one or a few kW of energy). In contrast, a traditional heating system would use about 30 kW of energy to achieve the same temperatures for the ceramic coating.

Furthermore, the microwave heating and induction heating can achieve target results using a heat treatment time of about 1 hour or less. In some embodiments, the heat treatment time of 1-15 minutes achieves target results of re-melting at least a portion of the ceramic coating to achieve a reduced porosity, an increased bond strength to the article, a reduced amount of cracking and/or a reduced surface roughness. In contrast, a conventional resistance heating or optical heating thermal process may take up to about 24 hours to achieve similar results. Accordingly, the microwave heating and induction heating provide significant increases in efficiency over traditional thermal treatment techniques. Moreover, flame heat treatment and laser heat treatment processes affect a small area at a time, and the flame or laser is moved over the surface of the heat treated article to eventually treat the entire surface. In contrast, microwave heat treatment and induction heat treatment can heat the entire ceramic coating at once.

Additionally, there are unique properties of microwave heat treating and induction heat treating that are particularly advantageous for processing ceramic coatings on articles. With respect to microwave heat treatment, microwaves heat objects from the inside and heat materials with loose bonds faster than materials with strong bonds. This phenomena can be exploited for yttrium-based oxide coatings. Yttrium-based oxide coatings such as $Y_2O_3$ include fairly weak gamma bonds that cause the yttrium-based oxide coatings to heat more quickly than other materials (e.g., more quickly than the article coated by the ceramic coating). Additionally, the surface of yttrium-based oxide coatings and other oxide ceramic coatings generally have dangling bonds that heat up more quickly than a remainder of the ceramic coating and the underlying article. This can enable the surface of the ceramic coating to be quickly heated to a target temperature before a remainder of the ceramic coating is similarly heated, melting the ceramic coating at the surface. The melted ceramic coating at the surface may reflow and form a much denser and smoother crust at the surface of the ceramic coating that lacks cracking that may be present in a remainder of the ceramic coating. Additionally, the crust may not include any dangling bonds that were initially present at the surface of the ceramic coating.

The microwave heat treatment may be further improved in embodiments by absorbing water or another liquid such as isopropyl alcohol (IPA) into pores in the ceramic coating. The liquid absorbed into the ceramic coating may facilitate quicker temperature ramp rates and/or a higher temperature in the ceramic coating.

With regards to induction heating, induction heating heats electrically conductive objects that are proximate to an induction coil (e.g., an electromagnet). Accordingly, in embodiments where the article is an electrically conductive article such as a metal article, induction heating can be applied to heat the metal article directly, where the metal article then heats the ceramic coating. This has the advantage that the ceramic coating heats from the bottom (interface with the article) up.

Native oxides generally form on metal surfaces, and these native oxides are often a point of failure for coatings over metal articles. By using induction heating, the native oxide and bottom of the ceramic coating may be heated first, and the native oxide and the bottom surface of the ceramic coating inter-diffuse to transform the native oxide layer into an intermediate layer that is an alloy of the native oxide and the ceramic coating. This alloy has a low porosity and minimal or no cracking in embodiments. In one embodiment, the intermediate layer has a porosity of less than 1%. The intermediate layer can improve an adhesion of the ceramic coating to the metal article and can further act as a diffusion barrier to prevent trace metals and other contaminants (e.g., Mg) from the metal article from diffusing to a surface of the ceramic coating.

A conductive plate may also be positioned proximate to a surface of the ceramic coating, and the conductive plate may be heated by induction heating. This may cause the ceramic coating to heat from the top down, and may cause a surface of the ceramic coating to melt, reflow, and form a crust as discussed above. If a conductive plate is used and the article is a metal article, then the ceramic coating may be heated from the top and the bottom simultaneously, resulting in an even quicker heating process.

In some embodiments, microwave heating and/or induction heating are used to generate a ceramic coating on an article. For example, a ceramic powder may be disposed on the article (e.g., by cold spraying). The microwave heating and/or induction heating may then be performed to melt the ceramic powder and cause the melted ceramic powder to flow and form a ceramic coating, which may be a sintered ceramic coating.

The term "heat treating" is used herein to mean applying an elevated temperature to an article, such as by a microwave heating system or an induction heating system. When the term "about" is used herein, this is intended to mean that the nominal value presented is precise within ±10%.

Note that some embodiments are described herein with reference to particular chamber components used, for example, in processing chambers (e.g., of plasma etchers) for semiconductor manufacturing. However, it should be understood that such processing chambers may also be used to manufacture micro-electro-mechanical systems (MEMS)) devices. Additionally, the heat treated articles described herein may be other structures that are exposed to plasma. For example, the articles may be ceramic coated rings, walls, bases, gas distribution plates, shower heads, substrate holding frames, etc. of a plasma etcher, a plasma cleaner, a plasma propulsion system, an atomic layer deposition (ALD) chamber, and so forth. Moreover, embodiments are described herein with reference to articles with heat treated ceramic coatings that cause reduced particle contamination when used in a process chamber for plasma rich processes. However, it should be understood that the articles discussed herein may also provide reduced particle contamination when used in process chambers for other processes such as non-plasma etchers, non-plasma cleaners, chemical vapor deposition (CVD) chambers, physical vapor deposition (PVD) chambers, plasma enhanced chemical vapor deposition (PECVD) chambers, plasma enhanced physical vapor deposition (PEPVD) chambers, plasma enhanced atomic layer deposition (PEALD) chambers, and so forth.

FIG. 1 is a sectional view of a semiconductor processing chamber 100 having one or more chamber components that are coated with a heat treated ceramic coating in accordance with embodiments. The processing chamber 100 may be used for processes in which a corrosive plasma environment having plasma processing conditions is provided. For example, the processing chamber 100 may be a chamber for a plasma etcher or plasma etch reactor, a plasma cleaner, plasma enhanced CVD or ALD reactors and so forth. The heat treated ceramic coating, which is described in greater detail below, is heat treated using a microwave heat treatment and/or an induction heat treatment. In one embodiment, the heat treated ceramic coating is one of $Y_2O_3$, $Er_2O_3$, $Y_3Al_5O_{12}$ (YAG), $Er_3Al_5O_{12}$ (EAG), or $Y_4Al_2O_9$ (YAM). The heat treated ceramic coating may also be $YAlO_3$ (YAP), $Er_4Al_2O_9$ (EAM), $ErAlO_3$ (EAP), a solid-solution of $Y_2O_3$—$ZrO_2$ and/or a ceramic compound comprising $Y_4Al_2O_9$ and a solid-solution of $Y_2O_3$—$ZrO_2$.

With reference to the solid-solution of $Y_2O_3$—$ZrO_2$, the rare-earth metal-containing oxide layer may include $Y_2O_3$ at a concentration of 10-90 molar ratio (mol %) and $ZrO_2$ at a concentration of 10-90 mol %. In some examples, the solid-solution of $Y_2O_3$—$ZrO_2$ may include 10-20 mol % $Y_2O_3$ and 80-90 mol % $ZrO_2$, may include 20-30 mol % $Y_2O_3$ and 70-80 mol % $ZrO_2$, may include 30-40 mol % $Y_2O_3$ and 60-70 mol % $ZrO_2$, may include 40-50 mol % $Y_2O_3$ and 50-60 mol % $ZrO_2$, may include 60-70 mol % $Y_2O_3$ and 30-40 mol % $ZrO_2$, may include 70-80 mol % $Y_2O_3$ and 20-30 mol % $ZrO_2$, may include 80-90 mol % $Y_2O_3$ and 10-20 mol % $ZrO_2$, and so on.

With reference to the ceramic compound comprising $Y_4Al_2O_9$ and a solid-solution of $Y_2O_3$—$ZrO_2$, in one embodiment the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0.1-60 mol % and $Al_2O_3$ in a range of 0.1-10 mol %. In another embodiment, the ceramic compound can include $Y_2O_3$ in a range of 40-60 mol %, $ZrO_2$ in a range of 30-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 70-90 mol %, $ZrO_2$ in a range of 0.1-20 mol % and $Al_2O_3$ in a range of 10-20 mol %. In another embodiment, the ceramic compound can include $Y_2O_3$ in a range of 60-80 mol %, $ZrO_2$ in a range of 0.1-10 mol % and $Al_2O_3$ in a range of 20-40 mol %. In another embodiment, the ceramic compound can include $Y_2O_3$ in a range of 40-60 mol %, $ZrO_2$ in a range of 0.1-20 mol % and $Al_2O_3$ in a range of 30-40 mol %. In other embodiments, other distributions may also be used for the ceramic compound.

In one embodiment, an alternative ceramic compound that includes a combination of $Y_2O_3$, $ZrO_2$, $Er_2O_3$, $Gd_2O_3$ and $SiO_2$ is used for the rare-earth metal-containing oxide layer. In one embodiment, the alternative ceramic compound can include $Y_2O_3$ in a range of 40-45 mol %, $ZrO_2$ in a range of 0-10 mol %, Er2O3 in a range of 35-40 mol %, Gd2O3 in a range of 5-10 mol % and $SiO_2$ in a range of 5-15 mol %. In a first example, the alternative ceramic compound includes 40 mol % $Y_2O_3$, 5 mol % $ZrO_2$, 35 mol % $Er_2O_3$, 5 mol % $Gd_2O_3$ and 15 mol % $SiO_2$. In a second example, the alternative ceramic compound includes 45 mol % $Y_2O_3$, 5 mol % $ZrO_2$, 35 mol % $Er_2O_3$, 10 mol % $Gd_2O_3$ and 5 mol % $SiO_2$. In a third example, the alternative ceramic compound includes 40 mol % $Y_2O_3$, 5 mol % $ZrO_2$, 40 mol % $Er_2O_3$, 7 mol % $Gd_2O_3$ and 8 mol % $SiO_2$.

Any of the aforementioned heat treated ceramic coating compositions may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

In one embodiment, the processing chamber 100 includes a chamber body 102 and a showerhead 130 that enclose an interior volume 106. The showerhead 130 may include a showerhead base and a showerhead gas distribution plate. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material. The chamber body 102 generally includes sidewalls 108 and a bottom 110.

An outer liner 116 may be disposed adjacent the sidewalls 108 to protect the chamber body 102. In one embodiment, the outer liner 116 is fabricated from aluminum oxide. In one embodiment, the outer liner 116 includes a heat treated ceramic coating.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 of the chamber body 102. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 may include a gas distribution plate (GDP) and may have multiple gas delivery holes 132 throughout the GDP. The showerhead 130 may include the GDP bonded to an aluminum base or an anodized aluminum base. The GDP may be made from Si or SiC, or may be a ceramic such as $Y_2O_3$, $Al_2O_3$, $Y_3Al_5O_{12}$ (YAG), and so forth. In some embodiments the showerhead 130 includes a heat treated ceramic coating 152 manufactured in accordance with embodiments described herein.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$. The lid and/or nozzle may include a heat treated ceramic coating in embodiments.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). A substrate support assembly 148 is disposed in the interior volume 106 of the processing chamber 100 below the showerhead 130 or lid. The substrate support assembly 148 holds a substrate 144 during processing. The surface of an electrostatic chuck of the substrate support assembly 148 may include a heat treated ceramic coating 154 in embodiments.

An inner liner may be coated on the periphery of the substrate support assembly 148. The inner liner may be a halogen-containing gas resist material such as those discussed with reference to the outer liner 116. In one embodiment, the inner liner may be fabricated from the same materials of the outer liner 116. In one embodiment, the inner liner includes a heat treated ceramic coating.

Figure 2:
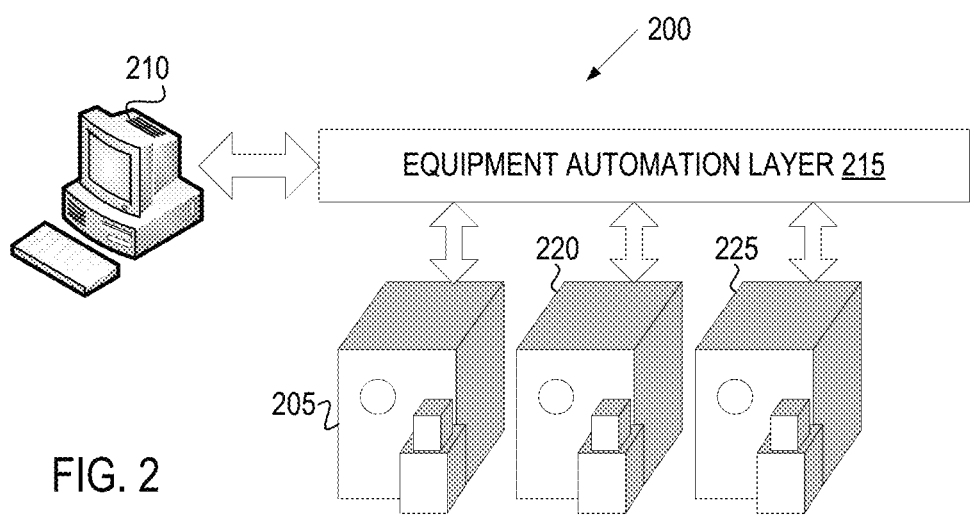
FIG. 2 illustrates an exemplary architecture of a manufacturing system, in accordance with one embodiment of the present invention.

FIG. 2 illustrates an example architecture of a manufacturing system 200. The manufacturing system 200 may be a manufacturing system for heat treating ceramic coatings on articles. In one embodiment, the manufacturing system 200 includes manufacturing machines 201 (e.g., processing equipment) connected to an equipment automation layer 215. The manufacturing machines 201 may include a deposition system 205, a microwave heating system 220, and/or an induction heating system 225. The manufacturing system 200 may further include one or more computing device 210 connected to the equipment automation layer 215. In alternative embodiments, the manufacturing system 200 may include more or fewer components. For example, the manufacturing system 200 may include manually operated (e.g., off-line) manufacturing machines 201 without the equipment automation layer 215 or the computing device 220.

Deposition system 205 is a chamber that deposits ceramic coatings. Deposition system 205 may be an atomic layer deposition (ALD) system, a plasma spraying system or an ion assisted deposition (IAD) system. Deposition system 205 may also be a cold spraying system.

Microwave heating system 220 uses electromagnetic waves to transfer heat. Microwave heating system 220 may include a magnetron, a waveguide and an antenna to produce microwaves at frequencies from about 4 kHz to about 2.4 GHz. Some example frequencies that may be used are 4 kHz, 13.56 kHz, 60 kHz, 120 kHz and 2.4 GHz. When used in embodiments, microwaves transfer energy to the ceramic coating and/or article in a process called dielectric heating. Microwaves may heat the ceramic coating uniformly.

Advantageously, if the article is metal then it may reflect a majority of the microwave energy rather than absorb it. The ceramic coating, however, may absorb the microwave radiation and be heated to temperatures of up to about 1500° C., 1800° C., or even 2000° C. in embodiments. Accordingly, the ceramic coating can be rapidly heated and undergo a heat treatment without adversely affecting the article. Additionally, many molecules such as water molecules are electric dipoles. Such molecules that are electric dipoles rotate to align with the alternating electric field of the microwaves. The rotating molecules collide with other molecules and impart kinetic energy to those other molecules, dispersing energy. Accordingly, in some embodiments the ceramic coating may be contacted with water or other liquid with an electric dipole. For example, the article with the ceramic coating may be dipped and/or soaked in a wet bath of water to cause the ceramic coating to absorb the water. The ceramic coating with the absorbed water or other liquid with an electric dipole may increase a rate a temperature ramp rate of the ceramic coating.

Induction heating system 225 heats electrically conductive objects (e.g., metal objects) by passing an alternating current though an induction plate, which may be or include an induction coil. The AC current in the induction plate causes electromagnetic induction in the electrically conductive object and the generation of heat by eddy currents from the electromagnetic induction. The eddy currents flowing through the electrically conductive object heat it by Joule heating and/or magnetic hysteresis losses. The frequency of the AC current, the size of the object, a material type of the object and a distance from the object to the induction plate may affect a penetration depth in the object, a ramp rate, and achievable temperatures. A notable feature of induction heating is that heat is generated inside the object itself instead of by an external heat source via heat conduction. This enables objects to be heated very rapidly. In embodiments, an induction plate may be placed near a surface of the ceramic coating on an article without touching the ceramic coating. The induction plate may then cause the surface of the article to heat up, and the surface of the article may then heat the ceramic coating. Additionally, or alternatively, an electrically conductive plate (e.g., a metal plate) may be placed between the induction plate and the ceramic coating. The electrically conductive plate may be placed proximate to the ceramic coating but not touching the ceramic coating. The electrically conductive plate may then be heated by induction heating to heat the ceramic coating.

Accordingly, microwave heating system 220 and induction heating system 225 are both machines designed to heat articles such as articles having ceramic coatings. Microwave heating system 220 and induction heating system 225 may include a thermally insulated chamber, capable of applying a controlled temperature on articles (e.g., ceramic articles) inserted therein. In one embodiment, the chamber is hermitically sealed. The chamber may include a pump to pump air out of the chamber, and thus to create a vacuum within the chamber. The chamber may additionally or alternatively include a gas inlet to pump gasses (e.g., inert gasses such as Ar or $N_2$) into the chamber.

Microwave heating system 220 and/or induction heating system 225 may be manual heating systems having a temperature controller that is manually set by a technician during processing of ceramic articles. Microwave heating system 220 and/or induction heating system 225 may also be off-line machines that can be programmed with a process recipe. The process recipe may control ramp up rates, ramp down rates, process times, temperatures, pressure, gas flows, and so on. Alternatively, microwave heating system 220 and/or induction heating system 225 may be on-line automated systems that can receive process recipes from computing devices 210 such as personal computers, server machines, etc. via an equipment automation layer 215. The equipment automation layer 215 may interconnect the microwave heating system 220 and/or induction heating system 225 with computing devices 210, with other manufacturing machines, with metrology tools and/or other devices.

The equipment automation layer 215 may include a network (e.g., a location area network (LAN)), routers, gateways, servers, data stores, and so on. Deposition system 205, microwave heating system 220 and/or induction heating system 225 to the equipment automation layer 215 via a SEMI Equipment Communications Standard/Generic Equipment Model (SECS/GEM) interface, via an Ethernet interface, and/or via other interfaces. In one embodiment, the equipment automation layer 215 enables process data (e.g., data collected by furnace 105 during a process run) to be stored in a data store (not shown). In an alternative embodiment, the computing device 210 connects directly to the microwave heating system 220 and/or induction heating system 225.

In one embodiment, microwave heating system 220 and/or induction heating system 225 includes a programmable controller that can load, store and execute process recipes. The programmable controller may control temperature settings, AC currents, energy settings, gas and/or vacuum settings, time settings, etc. of heat treatment processes. The programmable controller may control a heat up, may enable temperature to be ramped down as well as ramped up, may enable multi-step heat treating to be input as a single process, and so forth. The programmable controller may include a main memory (e.g., read-only memory (ROM), flash memory, dynamic random access memory (DRAM), static random access memory (SRAM), etc.), and/or a secondary memory (e.g., a data storage device such as a disk drive). The main memory and/or secondary memory may store instructions for performing heat treatment processes described herein.

The programmable controller may also include a processing device coupled to the main memory and/or secondary memory (e.g., via a bus) to execute the instructions. The processing device may be a general-purpose processing device such as a microprocessor, central processing unit, or the like. The processing device may also be a special-purpose processing device such as an application specific integrated circuit (ASIC), a field programmable gate array (FPGA), a digital signal processor (DSP), network processor, or the like. In one embodiment, programmable controller is a programmable logic controller (PLC).

In one embodiment, microwave heating system 220 and/or induction heating system 225 are programmed to execute a recipe that will cause the microwave heating system 220 and/or induction heating system 225 to heat treat an article with a ceramic coating using a heat treatment process described with reference to FIGS. 3-6C.

Figure 3:
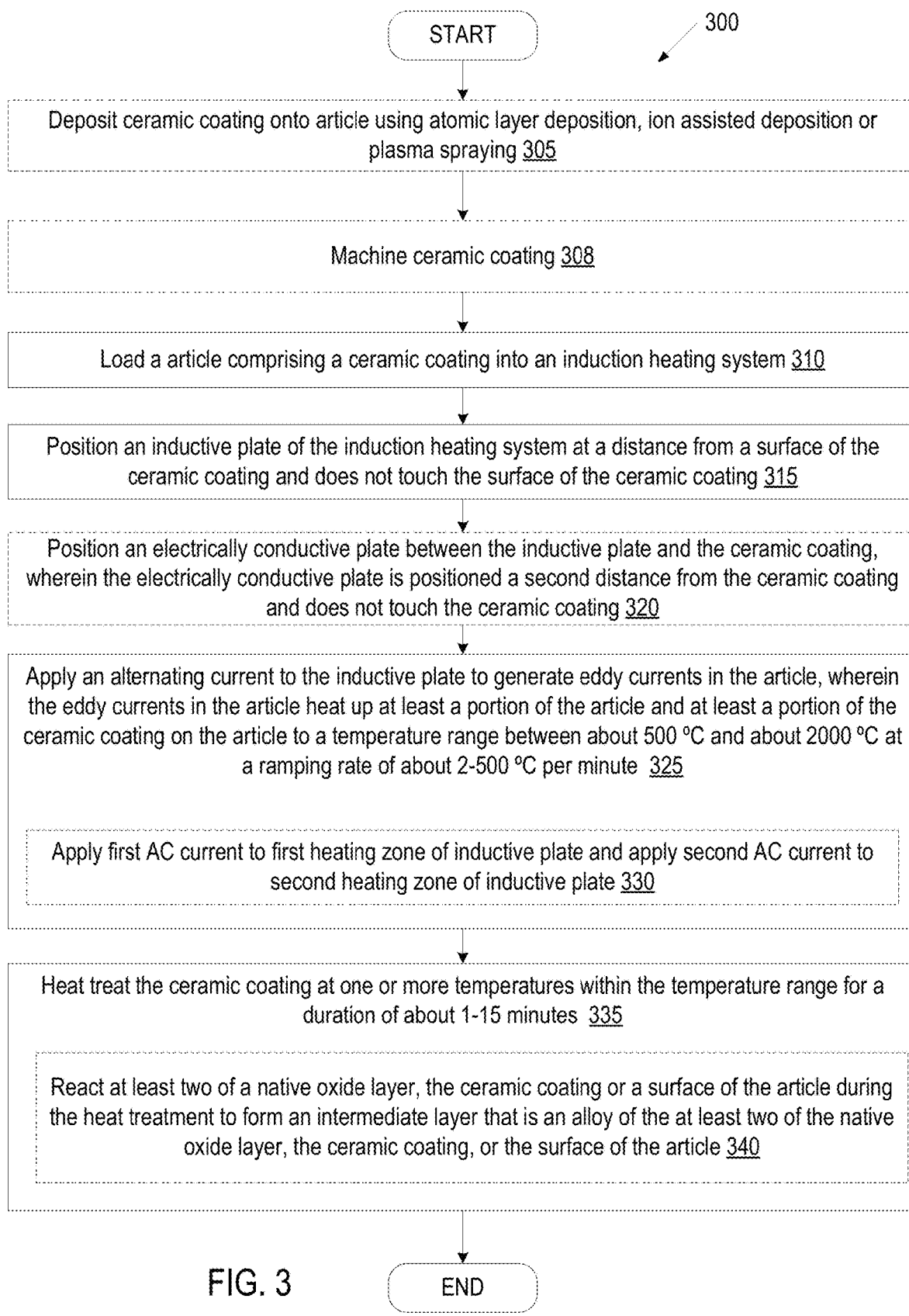
FIG. 3 illustrates a process for heat treating a metal article with a ceramic coating using an induction heating system, in accordance with one embodiment of the present invention.

FIG. 3 illustrates a process 300 for heat treating a metal article with a ceramic coating using an induction heating system, in accordance with one embodiment of the present invention. The metal article may be aluminum, an aluminum alloy (e.g., Al 6061, Al 6063, etc.), stainless steel, and so on. At block 305 of process 300, a ceramic coating may be deposited onto an article using ALD, IAD, plasma spraying, or another deposition technique. A ceramic coating deposited by ALD may have a porosity of effectively 0%, may be conformal and uniform, and may have a thickness of about 10 nm to about 1 μm. A ceramic coating deposited by IAD may have a porosity of effectively 0%, may be conformal, and may have a thickness of about 1-10 μm. A ceramic coating deposited by IAD may include a plurality of vertical cracks, which may be through vertical cracks. A ceramic coating deposited by plasma spraying may have a thickness of about 100 μm to about 20 mil (e.g., about 2-20 mil or 4-10 mil). The plasma sprayed ceramic coating may have a plurality of cracks, a porosity of about 0.5-10% (e.g., around 2-5%), and a relatively high average surface roughness of about 200-250 μ-inches in embodiments. The plasma sprayed ceramic coating may be a non-conformal coating. If the article is a metal article, then the article may include a native oxide, and the ceramic coating may be deposited over the native oxide. For example, an aluminum article may have a native oxide of $Al_2O_3$. The native oxide may have a thickness of about 5-10 nm in embodiments. The ceramic coating may be a yttrium-based oxide coating, and may be any of the ceramic coatings described herein above. For example, the ceramic coating may be $Y_2O_3$. Yttria dominant ceramics may be used due to the superior plasma resistance properties of yttrium-based oxides. In an alternative embodiment, an article already having a ceramic coating may be provided. Notably, the ceramic coating process may produce a ceramic coating having small voids such as pores, cracks and regions of incomplete bonding.

At block 308, the ceramic coating may be machined. Examples of machining include surface grinding, polishing, drilling, abrading, cutting, bead blasting, or otherwise processing with machine tools. In one embodiment, after the ceramic coating is formed over the ceramic substrate, the ceramic coating is polished. This may cause a large amount of particles, which may be trapped in cracks, pores and other surface defects of the ceramic coating.

The ceramic coating may initially have a weak adhesion strength (e.g., around 3 mega pascals (MPa)). This may cause the ceramic coating to delaminate or peel off of the ceramic substrate after time (e.g., as a result of using the ceramic article in plasma rich processes). Additionally, the ceramic coating may have an initial porosity, an initial amount of cracking and an initial surface roughness. These pores and cracks may enable process gasses and cleaning chemistries to penetrate the ceramic coating and react with the underlying ceramic substrate during processing. Such reactions may generate gasses, moisture or a different material under the ceramic coating, which may introduce blisters under the ceramic coating. These blisters may further cause the ceramic coating to separate from the ceramic substrate. Such separation may cause an elevated amount of particle contamination on processed material (e.g., processed wafers). Additionally, the blisters, cracks and pores (as well as other surface defects) may themselves cause particle contamination to processed substrates even in the absence of peeling.

In one example, pores, cracks, voids and other surface defects in the ceramic coating may include broken (or open) bonds that are high energy locations. These surface defects may trap particles. For example, the particles may form weak broken bonds with the ceramic article at the surface defect. During a plasma treatment, the plasma may break these weak broken bonds, and remove some of the particles from the ceramic coating. The ceramic particles may then be deposited on a processed substrate. Moreover, the plasma may break bonds of the ceramic article at the defect sites, at the pores, at the cracking, etc., which may erode the ceramic coating and cause additional particles to be created.

At block 310, the article with the ceramic coating is loaded into an induction heating system. In one embodiment, the ceramic article is automatically loaded by a loader. At block 315, an inductive plate of the induction heating system is positioned at a distance from a surface of the ceramic coating. The inductive plate may not tough the surface of the ceramic coating in embodiments.

At block 320, an electrically conductive plate may be positioned between the inductive plate and the ceramic coating. The electrically conductive plate may be positioned a second distance from the ceramic coating and may not touch the ceramic coating in embodiments. The electrically conductive plate may be used, for example, if the ceramic coating is relatively thick (e.g., thicker than a few mils) to enable a surface of the ceramic coating that is a distance from the surface of the article and that may not quickly heat up due to the distance from the surface of the article.

Additionally, the electrically conductive plate may be used if the article has a low electrical conductivity (e.g., if the article is a ceramic article rather than a metal article). In such an instance the article may not be heated by the induction heating since eddy currents are minimal in the article.

At block 320, an alternating current is applied to the inductive plate to generate eddy currents in the article. The eddy currents in the article heat up at least a portion of the article (e.g., the surface of the article nearest to the induction plate) and at least a portion of the ceramic coating on the article (e.g., the bottom surface of the ceramic coating that is proximate to the article surface.

If a conductive plate was used, then eddy currents are also induced in the conductive plate to heat the conductive plate. The heated conductive plate may then heat the ceramic coating starting from a surface of the ceramic coating nearest the conductive plate. Alternatively, if the article is not an electrically conductive article, then the eddy currents may be generated only in the conductive plate and not in the article. In such an embodiment the ceramic coating is not heated from the bottom up.

In some embodiments the induction plate has multiple heating zones. A different AC may be applied to each of the heating zones to induce differing amounts of eddy currents in the portion of the article and/or conductive plate that are proximate to those heating zones. Accordingly, different target temperatures and/or different ramping rates may be applied to different portions of the ceramic coating. For example, at block 330 a first AC current may be applied to a first heating zone of the inductive plate and a second AC current may be applied to a second heating zone of the inductive plate.

The ceramic coating is heated until it reaches a specified temperature or temperature range. The specified temperature may range from about 1000° C. to about 1800° C. One or more portions of the ceramic coating are heated to a temperature range of about 400° C. to about 2000° C. at a ramping rate of about 2-500° C. per minute.

At block 335, the ceramic coating is heat treated at the specified temperature or at one or more temperatures within the temperature range for a duration of about 1 minute to about 1 hour. In a further embodiment, the heat treatment is performed for a duration of about 1-15 minutes. In a further embodiment, the heat treatment is performed for a duration of about 5-15 minutes. The specific duration used may depend on a composition of the ceramic coating, a thickness of the ceramic coating and a composition of the article, as well as desired performance properties of the ceramic coating. The heat treating may cause at least a portion of the ceramic coating to re-melt and reform with collapsed grain boundaries into flatter agglomerates with a rounded or lenticular type macrostructure.

As discussed above, the ceramic coating may have a high number of surface defects and particles that are trapped by these surface defects. The heat treatment may reduce or eliminate these defects and/or particles. Specifically, the heat treatment may cause the particles to melt and/or may cause a portion of the ceramic coating to melt at the surface defect regions. The melted particles may flow together with the ceramic coating at the surface defect regions. The melted particles may then redeposit onto the ceramic coating and form unbroken bonds with the ceramic coating at these surface defect regions. The resultant unbroken bonds are much stronger than the broken bonds (dangling bonds) that previously bound the particles to the ceramic coating. Thus, the particles become much less susceptible to being removed from the ceramic coating during a plasma etch process, and the defect regions become less susceptible to erosion.

Additionally, the ceramic coating typically has a relatively high porosity and a relatively high amount of cracking. The heat treatment may cause the pores and the cracks to shrink and/or be removed. The pores and cracks may shrink or be eliminated based on the same melting and re-depositing of the ceramic coating discussed above. For example, the ceramic coating at a pore or crack may melt and then redeposit, filling and/or healing the port or crack.

In some embodiments the article is a metal article that includes a native oxide interposed between the metal article and the ceramic coating. In one embodiment, as set forth in block 340, the native oxide reacts with the ceramic coating during the heat treatment process to form an intermediate layer. Additionally, in some instances the article itself may also react with the native oxide and/or the ceramic coating to form the intermediate layer. In one embodiment, the native oxide layer has a thickness of about 5-10 nm, and the intermediate layer has a thickness of about 50-100 nm. Accordingly, all of the native oxide is consumed in the formation of the intermediate layer as well as a portion of the metal article and a portion of the ceramic coating. The intermediate layer may be $Y_4Al_2O_9$, $Y_3Al_5O_{12}$ (YAG), $Er_4Al_2O_9$, $Er_3Al_5O_{12}$, or a ceramic compound comprising $Y_4Al_2O_9$ and a solid-solution of $Y_2O_3$—$ZrO_2$ in some embodiments. In an example, if the native oxide is $Al_2O_3$ and the ceramic coating is a ceramic compound comprising $Y_4Al_2O_9$ and a solid-solution of $Y_2O_3$—$ZrO_2$, then the ceramic coating and native oxide may react during the heat treatment to form a YAG intermediate layer. In another example, if the native oxide is $Al_2O_3$ and the ceramic coating is $Y_2O_3$, then the ceramic coating and native oxide may react during the heat treatment to form a YAG intermediate layer. Other combinations of ceramic coating materials and native oxides will form other intermediate layers.

Notably, the intermediate layer may be a non-reactive and non-porous layer. Accordingly, during subsequent processing using a heat treated article, process gases may penetrate the ceramic coating, but may not penetrate the intermediate layer. Thus, the intermediate layer may prevent the process gasses from reacting with the ceramic substrate. This may minimize or prevent blistering, and may improve peeling performance and adhesion strength (bond strength) for the ceramic coating. Additionally, the intermediate layer may act as a diffusion barrier. In one embodiment, all of the native oxide layer is consumed to form the intermediate layer, and the intermediate layer has a thickness that is based on the original thickness of the native oxide layer.

In one embodiment, the ceramic coating is maintained at a single temperature for the duration of the heat treatment. Alternatively, the ceramic coating may be heated and/or cooled to multiple different temperatures within the temperature range during the heat treatment. For example, the ceramic coating may be heat treated at a temperature of 1500° C. for 5 minutes, may then be heat treated to a temperature of 1700° C. for another 5 minutes, and may then be heat treated at 1000° C. for another 5 minutes. Note that when multiple different heat treatment temperatures are used, the ceramic coating may be heated and/or cooled at the ramping rate to transition between heat treatment temperatures.

Figure 4:
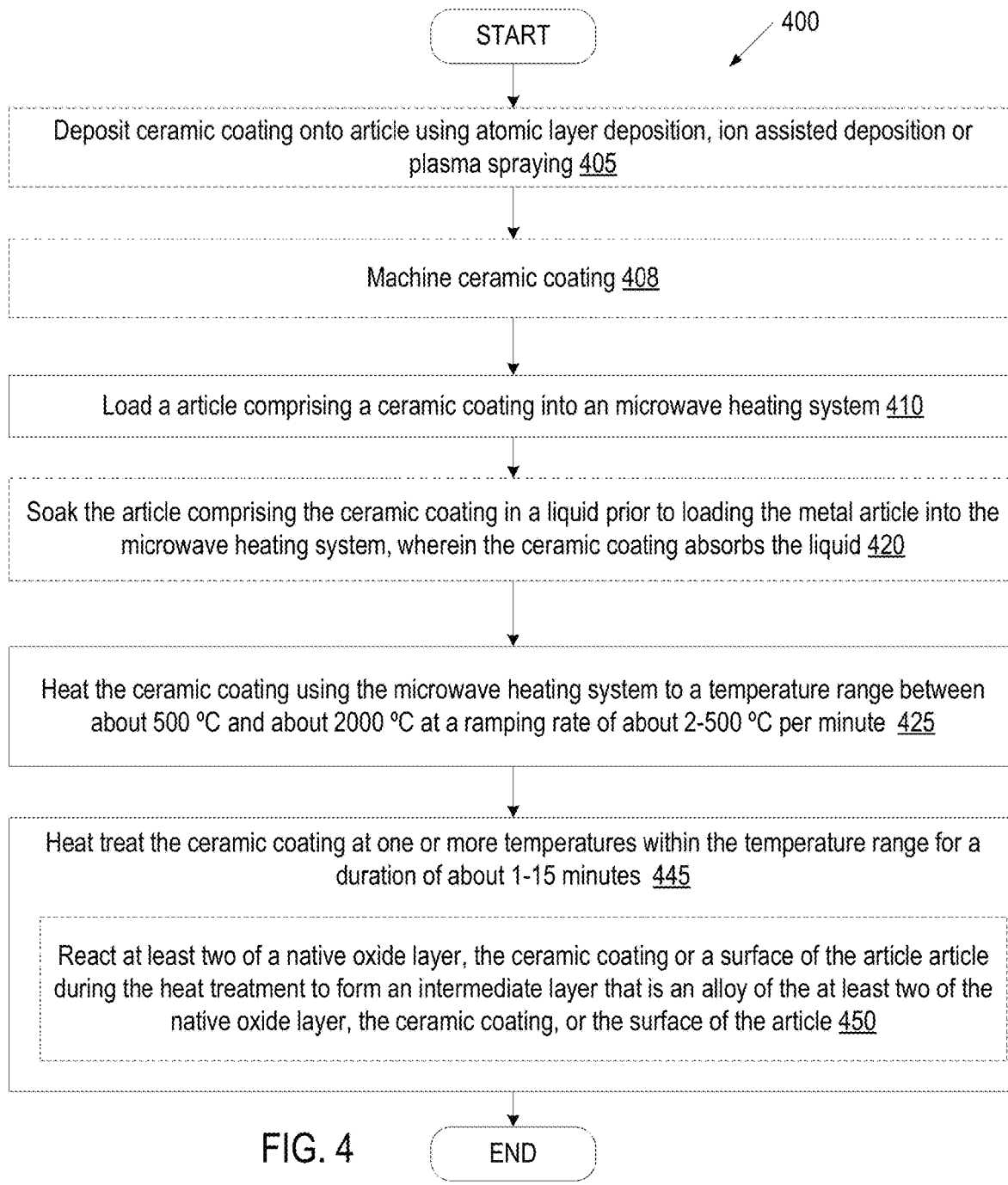
FIG. 4 illustrates a process for heat treating an article with a ceramic coating using a microwave heating system, in accordance with one embodiment of the present invention.

FIG. 4 illustrates a process 400 for heat treating an article with a ceramic coating using a microwave heating system, in accordance with one embodiment of the present invention. At block 405 of process 400, a ceramic coating may be deposited onto an article using ALD, IAD, plasma spraying, or another deposition technique. The article may be a metal article such as aluminum, an aluminum alloy (e.g., Al 6061, Al 6063, etc.), stainless steel, and so on. The article may alternatively be a ceramic article such as AlN, $Al_2O_3$, $SiO_2$, SiN, SiC, and so on. If the article is a metal article, then the article may include a native oxide, and the ceramic coating may be deposited over the native oxide. The native oxide may have a thickness of about 5-10 nm in embodiments. The ceramic coating may be a yttrium-based oxide coating, and may be any of the ceramic coatings described herein above. In an alternative embodiment, an article already having a ceramic coating may be provided. Notably, the ceramic coating process may produce a ceramic coating having small voids such as pores, cracks and regions of incomplete bonding.

At block 408, the ceramic coating may be machined. Examples of machining include surface grinding, polishing, drilling, abrading, cutting, bead blasting, or otherwise processing with machine tools. In one embodiment, after the ceramic coating is formed over the ceramic substrate, the ceramic coating is polished. This may cause a large amount of particles, which may be trapped in cracks, pores and other surface defects of the ceramic coating.

The ceramic coating may initially have a weak adhesion strength (e.g., around 3 mega pascals (MPa)). Additionally, the ceramic coating may have an initial porosity, an initial amount of cracking and an initial surface roughness. In one example, pores, cracks, voids and other surface defects in the ceramic coating may include broken (or open) bonds that are high energy locations that may trap particles.

At block 410, the article with the ceramic coating is loaded into a microwave heating system. In one embodiment, the ceramic article is automatically loaded by a loader. At block 415, the article with the ceramic coating may be dipped and/or soaked in a wet bath containing water or another polar liquid. The ceramic coating may absorb the liquid. In one embodiment, the ceramic coating is soaked in the wet bath for a duration of 30 seconds to 15 minutes. Alternatively, a liquid such as water may be sprayed on a surface of the ceramic coating.

At block 425, microwave heating is performed to heat the ceramic coating to a specified temperature of about 400-2000° C. One or more portions of the ceramic coating are heated to the specified temperature at a ramping rate of about 2-500° C. per minute. In some embodiments the ceramic coating is quickly heated without also heating the article (or with minimal heating of the article). Accordingly, the ceramic coating may be heated to temperatures that could ordinarily damage the article without a negative impact on the article. The microwave heating may heat dandling bonds at a surface of the ceramic coating more quickly than a remainder of the ceramic coating in some embodiments. Additionally, the water or other polar liquid absorbed by the ceramic coating may cause the ceramic coating to heat up more quickly.

At block 445, the ceramic coating is heat treated at the specified temperature or at one or more temperatures within the temperature range for a duration of about 1 minute to about 1 hour. In a further embodiment, the heat treatment is performed for a duration of about 1-15 minutes. In a further embodiment, the heat treatment is performed for a duration of about 5-15 minutes. The specific duration used may depend on a composition of the ceramic coating, a thickness of the ceramic coating and a composition of the article, as well as desired performance properties of the ceramic coating. The heat treating may cause at least a portion of the ceramic coating to re-melt and reform with collapsed grain boundaries into flatter agglomerates with a rounded or lenticular type macrostructure.

As discussed above, the ceramic coating may have a high number of surface defects and particles that are trapped by these surface defects. The heat treatment may reduce or eliminate these defects and/or particles. Specifically, the heat treatment may cause the particles to melt and/or may cause a portion of the ceramic coating to melt at the surface defect regions. The melted particles may flow together with the ceramic coating at the surface defect regions. The melted particles may then redeposit onto the ceramic coating and form unbroken bonds with the ceramic coating at these surface defect regions.

Additionally, the ceramic coating typically has a relatively high porosity and a relatively high amount of cracking. The heat treatment may cause the pores and the cracks to shrink and/or be removed. The pores and cracks may shrink or be eliminated based on the same melting and re-depositing of the ceramic coating discussed above. For example, the ceramic coating at a pore or crack may melt and then redeposit, filling and/or healing the port or crack.

In some embodiments the article is a metal article that includes a native oxide interposed between the metal article and the ceramic coating. In one embodiment, as set forth in block 450, the native oxide reacts with the ceramic coating during the heat treatment process to form an intermediate layer, as discussed above with reference to FIG. 3.

In one embodiment, the ceramic coating is maintained at a single temperature for the duration of the heat treatment. Alternatively, the ceramic coating may be heated and/or cooled to multiple different temperatures within the temperature range during the heat treatment. For example, the ceramic coating may be heat treated at a temperature of 1500° C. for 5 minutes, may then be heat treated to a temperature of 1700° C. for another 5 minutes, and may then be heat treated at 1000° C. for another 5 minutes. Note that when multiple different heat treatment temperatures are used, the ceramic coating may be heated and/or cooled at the ramping rate to transition between heat treatment temperatures.

Figure 5:
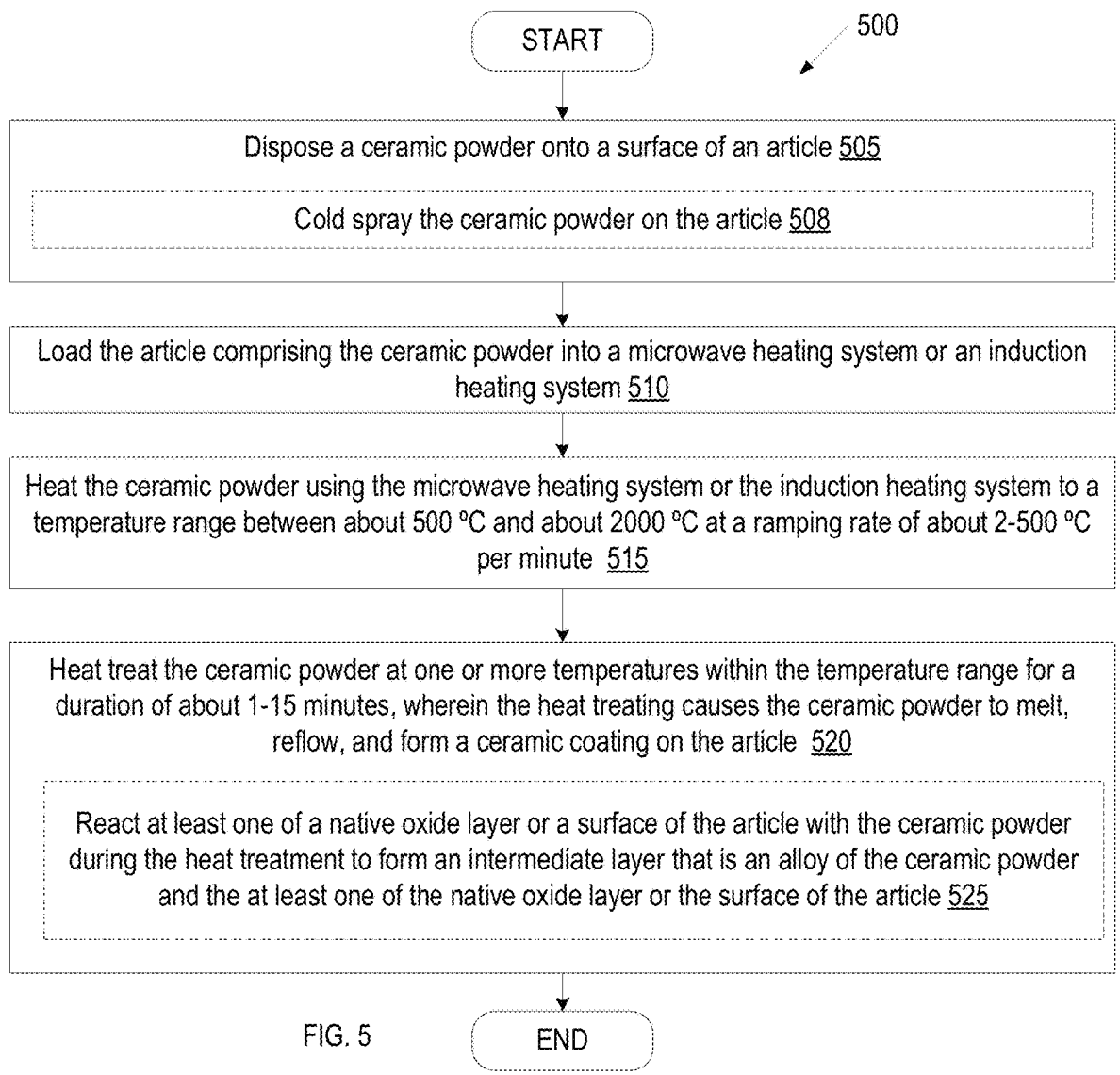
FIG. 5 illustrates a process for forming a ceramic coating on an article from a ceramic powder using heat treatment from a microwave heating system or an induction heating system, in accordance with one embodiment of the present invention.

FIG. 5 illustrates a process 500 for forming a ceramic coating on an article from a ceramic powder using heat treatment from a microwave heating system or an induction heating system, in accordance with one embodiment of the present invention. At block 505 of method 500 a ceramic powder is disposed on a surface of an article. The article may be a metal article or a ceramic article. The article may be a metal article such as aluminum, an aluminum alloy (e.g., Al 6061, Al 6063, etc.), stainless steel, and so on. The article may alternatively be a ceramic article such as AlN, $Al_2O_3$, $SiO_2$, SiN, SiC, and so on. In one embodiment, the article is a metal article with a native oxide layer at a surface of the metal article. In one embodiment, at block 508 disposing the ceramic powder on the surface of the article comprises performing a cold spray process to deposit the ceramic powder on the surface of the article. The ceramic powder may be a powder form of any of the ceramic materials discussed herein above. Examples of ceramic powders that may be used include $Y_2O_3$, $Er_2O_3$, $Y_4Al_2O_9$, $Y_3Al_5O_{12}$, $Er_4Al_2O_9$, $Er_3Al_5O_{12}$, a solid-solution of $Y_2O_3$—$ZrO2$, and a ceramic compound comprising $Y_4Al_2O_9$ and a solid-solution of $Y_2O_3$—$ZrO_2$.

At block 510, the article with the ceramic powder on its surface is loaded into a microwave heating system or an induction heating system. At block 515, the ceramic powder is heated using the microwave heating system or the induction heating system to a temperature range of about 400-

2000° C. at a ramping rate of about 2-500° C. per minute. At block 520, the ceramic powder is heat treated at one or more temperatures within the temperature range for a duration of about 1 minute to about 1 hour (e.g., about 1-15 minutes). The heat treatment causes the ceramic powder to melt, reflow and form a ceramic coating on the article. The ceramic coating may have a low porosity, a low surface roughness, and a thickness of about 2-4 mil. Additionally, the ceramic coating may have an adhesion strength of greater than 20 MPa. Prior to heat treatment the adhesion is 10-15 mega pascals (MPa).

In one embodiment the article is a metal article with a native oxide layer. At block 525, the native oxide layer and/or a surface of the metal article reacts with the ceramic powder during the heat treatment to convert the native oxide layer into an intermediate layer that is an alloy of the native oxide layer, a portion of the ceramic powder and/or a portion of the article. The intermediate layer may correspond to any of the aforementioned intermediate layers.

Figure 6A:
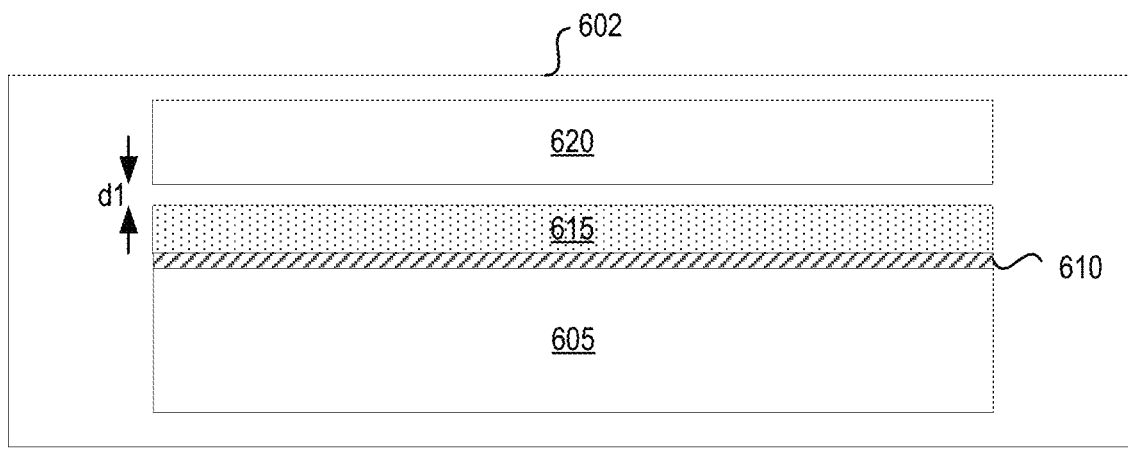
FIG. 6A depicts a cross sectional side view of a metal article in an induction heating system.

FIG. 6A depicts a cross sectional side view of a metal article 605 in an induction heating system 602. The metal article 605 includes a native oxide 610 and a ceramic coating 615 on a surface of the metal article 605. An induction plate 620 is positioned above the ceramic coating at a distance d1 from the ceramic coating. During a heat treatment process an alternating current may be input into the induction plate to cause the metal article 605 to heat up near a surface of the metal article. The heated surface of the metal article 605 then heats the native oxide 610 and the ceramic coating 615. The native oxide 610 is converted into an alloy of at least the native oxide and a bottom surface of the ceramic coating 615.

Figure 6B:
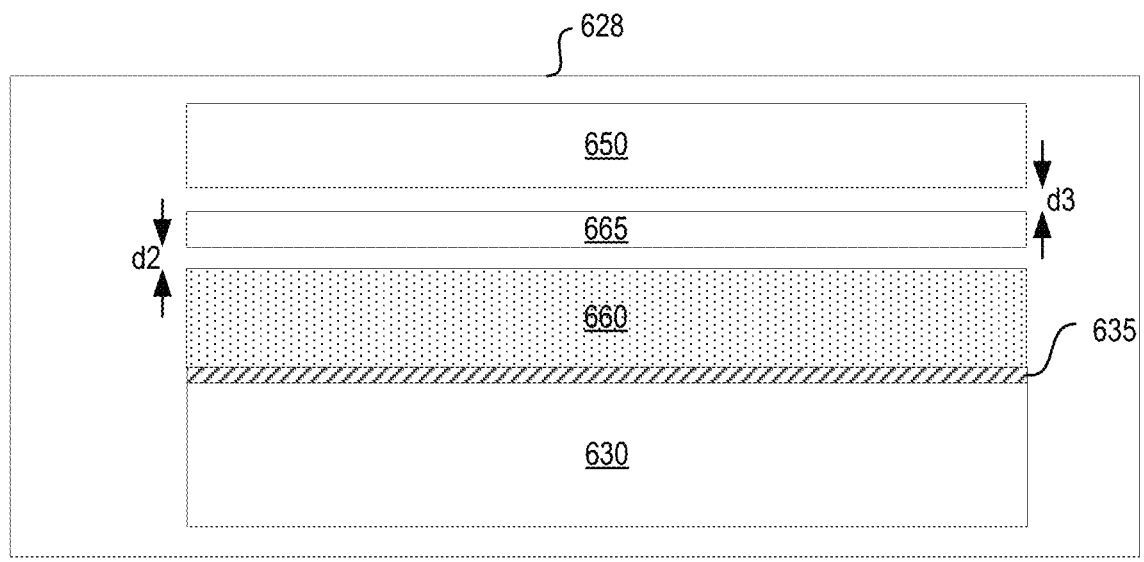
FIG. 6B depicts a cross sectional side view of an article in an induction heating system.

FIG. 6B depicts a cross sectional side view of an article 630 in an induction heating system 628. The article 630 may or may not be a metal article. If the article 630 is a metal article, then the article 605 may include a native oxide 635. If the article is a ceramic article, then the article may not include a native oxide. The article 630 includes a ceramic coating 660 on a surface of the article (which may be over the native oxide 635). An electrically conductive plate 665 (e.g., a metal plate) is placed a distance d2 from a surface of the ceramic coating 660. An induction plate 650 is placed a distance d3 from the electrically conductive plate 665. Alternatively, the induction plate 650 may touch the electrically conductive plate 665. A second induction plate may also be disposed beneath the article 630, and may or may not touch the bottom surface of the article 630.

If the article 630 is metal, then the article 630 may heat by induction heating and the electrically conductive plate 665 may also heat by induction heating. The electrically conductive plate 665 may heat a top surface of the ceramic coating 660 and the article 630 may heat a bottom surface of the ceramic coating 660. Alternatively, the article 630 may be placed sufficiently far from the electrically conductive plate 665 that the article 630 is only minimally heated.

If the article 630 is a ceramic, then the article 630 is not heated by the induction heating (or is minimally heated by the induction heating). The electrically conductive plate 665 may be heated by the induction heating, and the electrically conductive plate 665 may heat the ceramic coating starting with a surface of the ceramic coating 660.

If the article 630 is a metal article, then the heated surface of the metal article and/or ceramic coating 660 may heat the native oxide 635. The native oxide 635 may be converted into an alloy of at least the native oxide and a bottom surface of the ceramic coating 660.

Figure 6C:
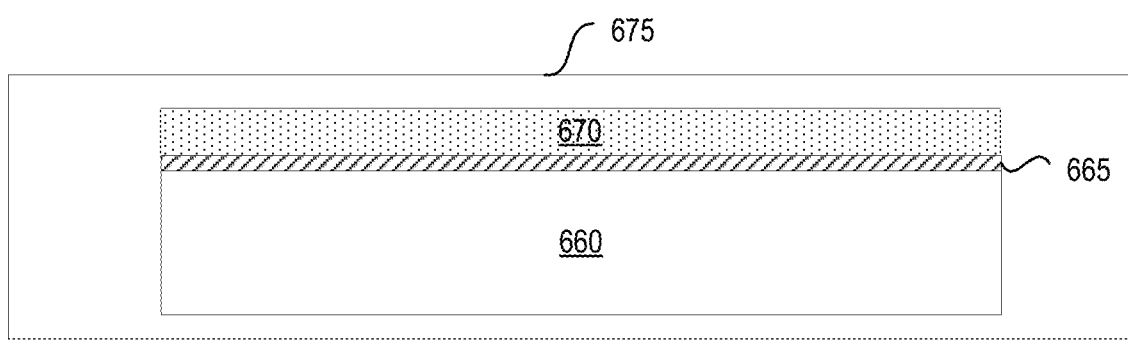
FIG. 6C depicts a cross sectional side view of an article in a microwave heating system.

FIG. 6C depicts a cross sectional side view of an article 660 in a microwave heating system 675. The article may be a metal article or a ceramic article. If the article is a metal article, then the article may include a native oxide 665. A ceramic coating 670 may cover a surface of the article 660. A microwave heat treatment may be performed on the ceramic coating as set forth above.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of embodiments of the invention should, therefore, be determined with reference to the appended claims, along with the full scope of equivalents to which such claims are entitled.

What is claimed is:

1. A method comprising:
    loading a metal article comprising a ceramic coating and a native oxide layer between the metal article and the ceramic coating into an induction heating system;
    positioning an inductive plate of the induction heating system at a distance from a surface of the ceramic coating that does not touch the surface of the ceramic coating;
    applying an alternating current to the inductive plate to generate eddy currents in the metal article, wherein the eddy currents in the metal article heat up at least a portion of the metal article and at least a portion of the ceramic coating on the metal article to a temperature range between about 400° C. and about 2000° C. at a ramping rate of about 2-500° C. per minute; and
    performing a heat treatment on the ceramic coating at one or more temperatures within the temperature range for a duration of about 1-15 minutes, wherein at least two of the native oxide layer, the ceramic coating, or a surface of the metal article react during the heat treatment to form an intermediate layer comprising an alloy of at least two of the native oxide layer, the ceramic coating or the surface of the metal article, and wherein the intermediate layer acts as a diffusion barrier.

2. The method of claim 1, wherein the ceramic coating is a plasma sprayed ceramic coating that has a thickness of 2-20 mils, an initial porosity of about 0.5-10%, an initial surface roughness, and an initial amount of cracking, and wherein after the heat treating the ceramic coating has a reduced porosity that is below the initial porosity, a reduced surface roughness that is below the initial surface roughness, and a reduced amount of cracking that is below the initial amount of cracking.

3. The method of claim 1, wherein:
the metal article comprises aluminum;
the native oxide layer comprises $Al_2O_3$;
the ceramic coating is selected from a group consisting of $Y_2O_3$, $Y_4Al_2O_9$, $Y_3Al_5O_{12}$, $Er_2O_3$, $Er_4Al_2O_9$, $Er_3Al_5O_{12}$, a solid solution of $Y_2O_3$—$ZrO_2$, a solid solution of $Y_2O_3$—$Er_2O_3$, and a ceramic compound comprising $Y_4Al_2O_9$ and a solid-solution of $Y_2O_3$—$ZrO_2$; and
the intermediate layer is selected from a group consisting of $Y_4Al_2O_9$, $Y_3Al_5O_{12}$, $Er_4Al_2O_9$, $Er_3Al_5O_{12}$, and a ceramic compound comprising $Y_4Al_2O_9$ and a solid-solution of $Y_2O_3$—$ZrO_2$.

4. The method of claim 1, wherein prior to the heat treatment the native oxide layer has a thickness of 5-10 nm, and wherein after the heat treatment an entirety of the native oxide layer is consumed and the intermediate layer has a thickness of 50-100 nm.

5. The method of claim 1, wherein the intermediate layer has a porosity of less than 1%.

6. The method of claim 1, further comprising:
positioning an electrically conductive plate between the inductive plate and the ceramic coating, wherein the electrically conductive plate is positioned a second distance from the ceramic coating that does not touch the ceramic coating, wherein the alternating current applied to the inductive plate causes additional eddy currents in the electrically conductive plate, wherein the eddy currents in the electrically conductive plate heat up the electrically conductive plate and at least a surface of the ceramic coating to the temperature range between about 400° C. and about 2000° C. at the ramping rate of about 2-500° C. per minute.

7. The method of claim 1, wherein the heat treating causes the ceramic coating to heat starting from an interface of the native oxide layer with the metal article.

8. The method of claim 1, further comprising:
depositing the ceramic coating onto the metal article comprising the native oxide layer prior to loading the metal article into the induction heating system, wherein the ceramic coating is deposited using a deposition technique selected from a group consisting of atomic layer deposition, ion assisted deposition and plasma spraying.

9. The method of claim 1, wherein the inductive plate comprises a plurality of heating zones, and wherein each of the plurality of heating zones can be subject to a distinct alternating current to produce a distinct temperature in a proximate portion of the ceramic coating.

10. The method of claim 1, wherein the alloy comprises an alloy of the native oxide layer, the ceramic coating, and the surface of the metal article.

11. The method of claim 1, wherein the alloy comprises an alloy of the native oxide layer and the ceramic coating.

12. The method of claim 1, wherein the alloy comprises an alloy of the native oxide layer and the surface of the metal article.

13. The method of claim 1, wherein the alloy comprises an alloy of the surface of the metal article and the ceramic coating.

* * * * *